United States Patent [19]

Lagarde et al.

[11] Patent Number: 5,200,487
[45] Date of Patent: Apr. 6, 1993

[54] PROCESS FOR THE SYNTHESIS OF POLYSILSESQUIOXANES AND APPLICATION OF THE COMPOUNDS OBTAINED

[75] Inventors: Marc Lagarde, Strasbourg; Dominique Broussoux, Marcoussis; Jean-Claude Dubois, St Remy les Chevreuses, all of France

[73] Assignee: Thomson-CSF, Puteaux, France

[21] Appl. No.: 630,507

[22] Filed: Dec. 20, 1990

[30] Foreign Application Priority Data

Dec. 28, 1989 [FR] France .................. 89 17315

[51] Int. Cl.$^5$ .............................................. C08G 77/06
[52] U.S. Cl. ........................................ 528/21; 528/10; 556/466
[58] Field of Search .............. 528/10, 21; 556/466

[56] References Cited

FOREIGN PATENT DOCUMENTS 0163538 12/1985 European Pat. Off. .
0198976 10/1986 European Pat. Off. .
0255303  2/1988 European Pat. Off. .

WO8605284  9/1986 PCT Int'l Appl. .

Primary Examiner—Melvyn I. Marquis
Attorney, Agent, or Firm—Oblon, Spivak, McClelland, Maier & Neustadt

[57] ABSTRACT

Disclosed is a process for the synthesizing of polysilsesquioxane, including a first step for the hydrolysis, in the presence of ether, of trichlorosilane with the general formula $RSiCl_3$ where R represents an organic radical, notably an alkyl, an aryl, a vinyl or an allyl, said process further including the following steps;

2nd step: the dissolving of the solid product obtained at the end of the first step in an anhydrous ketonic solvent and the addition of a base, the reaction taking place under heat, a solid product being obtained after evaporation and drying;

3rd step: the dissolving of the solid product obtained at the end of the second step in an anyhydrous ketone, the addition of a chain-terminating agent, the reaction taking place under heat and the solution obtained being filtered, evaporated and dried to give the desired polysilsesquioxane, wherein the second step is repeated several times.

4 Claims, 2 Drawing Sheets

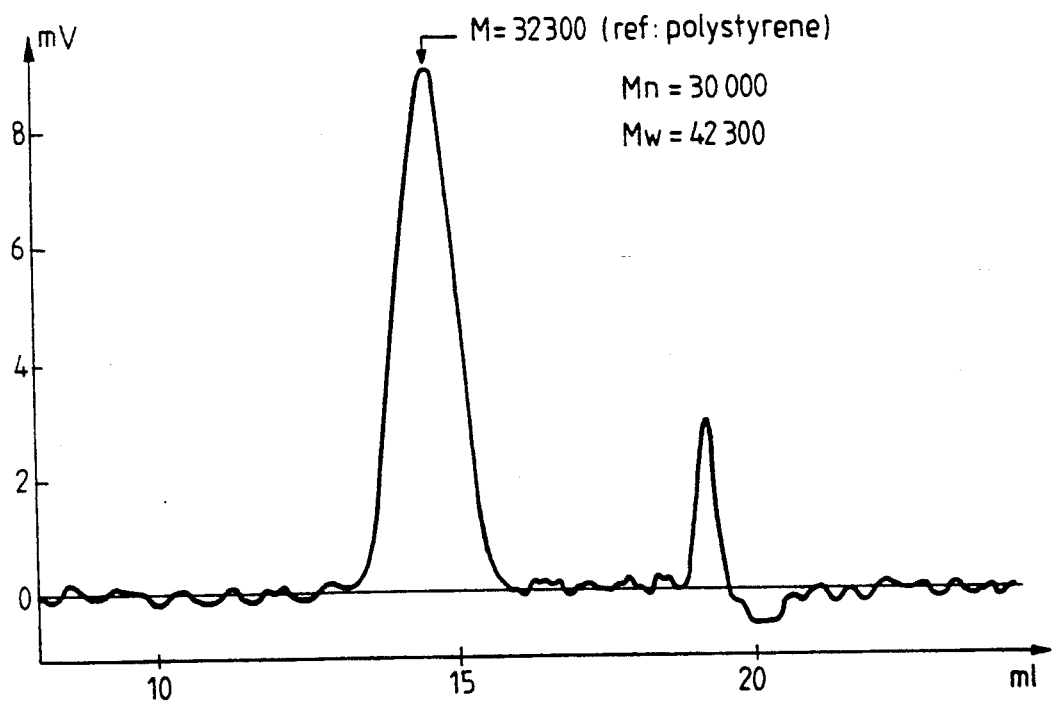

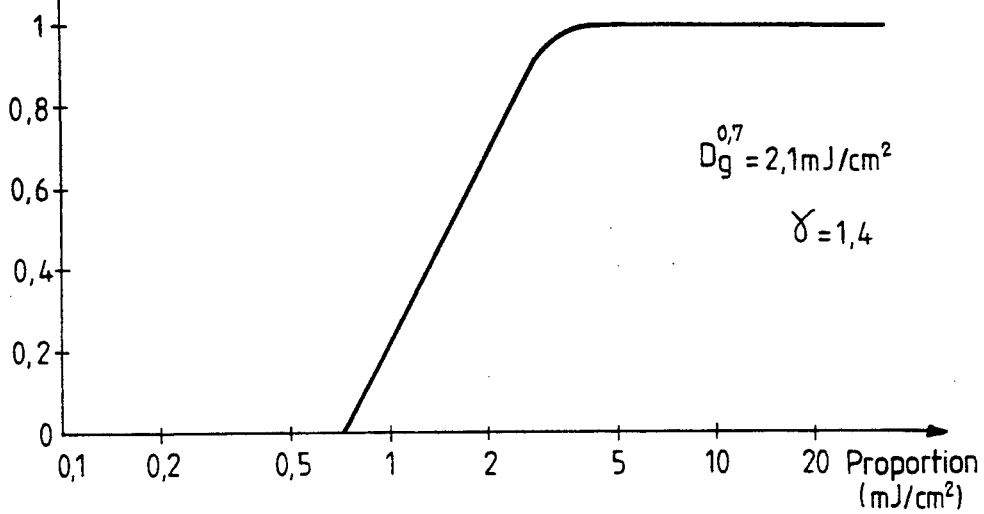
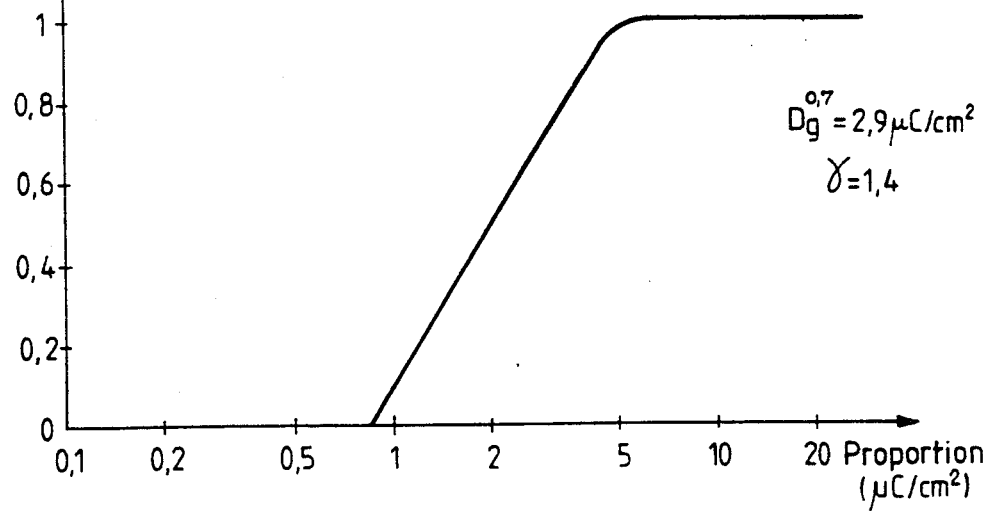

PROCESS FOR THE SYNTHESIS OF POLYSILSESQUIOXANES AND APPLICATION OF THE COMPOUNDS OBTAINED

BACKGROUND OF THE INVENTION

1. Field of the Invention

The present invention concerns a new process for the chemical synthesis of polysilsesquioxanes giving compounds with high molecular mass and reduced polydispersivity and increased stability over time. These improvements enable the performance characteristics of the polysilsesquioxanes to be used in applications in microelectronics, in using them to make a negative resin with very high sensitivity and high contrast for insolation by electrons or X-rays, or more generally for use in integrated optics.

The use of siliceous polymers in microelectronics has developed in recent years because such materials, more especially polysilsesquioxanes, are filmogenic and have many uses in microelectronics.

2. Description of the Prior Art

The first modes of synthesis of polysilsesquioxanes have drawn inspiration from the process described by G. H. WAGNER et al. in *Ind. and Eng. Chem.*, vol. 45, No. 2 (1953), pages 367-374. According to this process, the compound $RSiCl_3$ is hydrolyzed (R may be an alkyl radical, for example $CH_3$ or $C_2H_5$, or an aryl radical, for example $C_6H_5$, or allyl radicals, the most valuable of them from the viewpoint of the applications being the vinyl radical $CH_2=CH$). This hydrolysis is done in an ether at low temperature (0° to 5° C.) with a great excess of water. Then, the organic phase is washed abundantly and it is treated to remove the residues of hydrochloric acid while, at the same time, promoting the oligomerization of the product. The etherified phase is then dried, and an oily low-mass oligomer is obtained.

An appreciable improvement in this process has been described in the patent FR 2 144 024 which teaches that, by the optimizing of a quantity of ammonia added, it is possible to achieve a condensation of the products of hydrolysis and to obtain a polymer with a mass of about 1300 having about 2% of residual OH groups. However, this process has the drawback of excessive dispersivity and a relatively low mass as well as an appreciable aging of the polymer due to the presence of the OH groups.

Other patent applications have been filed with a view to making improvements in the above-mentioned processes.

JP 62. 283 128 describes the synthesis of polyallylsilsesquioxane (in this case, R is the group $CH_2CH=CH_2$) terminated by hydroxyl radicals. However, the presence of these hydroxyl radicals means that the compound obtained has little stability under temperature.

EP 255 303 describes a process for the synthesis of the copolymer

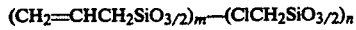

$(CH_2=CHCH_2SiO_{3/2})_m-(ClCH_2SiO_{3/2})_n$ where m varies between 0 and 100 and $m+n=100$. The authors use the above-mentioned Wagner process but in complementing it with a subsequent reprocessing of the product obtained. This is a second polymerization done in a ketonic solvent in the presence of a base. This process is known to achieve an effective increase in the masses of the polysiloxanes but is not enough to reduce the polydispersivity to below 1.5.

Owing to their low molecular mass, their high polydispersivity and the presence of non-stabilized terminal groupings, the materials obtained by these various processes have low performance values in X-ray or electron microlithography.

SUMMARY OF THE INVENTION

The invention seeks to overcome these drawbacks. It makes it possible to obtain compounds having an increased molecular mass (thus increasing their sensitivity to radiation and their filmogenic character) and reduced polydispersivity (thus increasing selectivity during the developing process, and hence increasing the resolution). The invention also makes it possible to obtain products that are particularly stable over time and immune to unwanted reactions. The process according to the invention includes three steps: the first step corresponds to the Wagner process, the second step brings an extremely anhydrous ketonic solvent into play and the third step uses a ketone which is also extremely anhydrous and a chain-terminating agent.

An object of the invention, therefore, is a process for the synthesizing of polysilsesquioxane, including a first step for the hydrolysis, in the presence of ether, of trichlorosilane with the general formula $RSiCl_3$ where R represents an organic radical, notably an alkyl, an aryl, a vinyl or an allyl, said process further including the following steps;

2nd step: the dissolving of the solid product obtained at the end of the first step in an anhydrous ketonic solvent and the addition of a base, the reaction taking place under heat, a solid product being obtained after evaporation and drying;

3rd step: the dissolving of the solid product obtained at the end of the second step in an anyhydrous ketone, the addition of a chain-terminating agent, the reaction taking place under heat and the solution obtained being filtered, evaporated and dried to give the desired polysilsesquioxane, wherein the second step is repeated several times.

BRIEF DESCRIPTION OF THE DRAWINGS

The invention will be understood more clearly and other advantages will be understood from the following description, given as a non-restrictive example, and from the appended drawings, of which:

FIG. 1 shows a recording of gel permeation chromatography;

FIGS. 2 and 3 show graphs of sensitivity of the compound obtained by the process of the invention.

DETAILED DESCRIPTION OF THE INVENTION

According to the invention, therefore, the process takes places in three steps. The general process of synthesis is the following in the case of polyvinylsilsesquioxane.

During the first step, a mixture of ether and vinyltrichlorosilane (50/50 by volume) is poured into a mixture of ice and ether. After a few minutes of hydrolysis, ether is added and the mixture is shaken vigorously. The mixture is allowed to decant and then the organic phase is collected, washed, dried and then evaporated. A little ammonia can be added into a washing water to remove the hydrochloric acid and oligomerize the product.

The following reaction takes place:

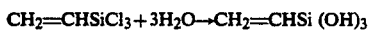
$$CH_2=CHSiCl_3 + 3H_2O \rightarrow CH_2=CHSi(OH)_3$$

which, in turn, gives oligomers with a cyclic structure and a mass ranging from 100 to 1500.

During the second step, the solid collected earlier is dissolved in an extremely anhydrous ketonic solvent (i.e. one with a controlled water content practically between 10 and 1000 ppm), and it is allowed to react for at least ten hours at high temperature in the presence of a base. After intensive evaporation and drying, this step is recommenced several times in succession, depending on the mass desired. For, it is the reaction time in the extremely anhydrous solvent that will determine the degree of polymerization. The oligomers give a compound

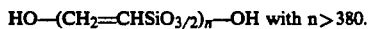
$$HO-(CH_2=CHSiO_{3/2})_n-OH \text{ with } n>380.$$

If the second step is repeated once, the degree of polymerization n is greater than 500. If it is repeated several times, it increases further.

A critical factor is the control of the water content of the solvent.

During the third step, the solid obtained at the end of the second step is dissolved in an extremely anhydrous ketone (i.e. one with a controlled water content practically between 10 and 1000 ppm), and a slightly smaller quantity of a base is added as well as a large excess of a chain-terminating agent (a chemically inert group). After a few hours of reaction at high temperature, the solution is filtered to remove the salt, and is then evaporated and dried.

The following reaction takes place when the chain-terminating agent is $(CH_3)_3SiCl$

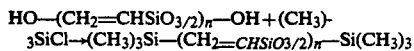
$$HO-(CH_2=CHSiO_{3/2})_n-OH + (CH_3)_3SiCl \rightarrow (CH_3)_3Si-(CH_2=CHSiO_{3/2})_n-Si(CH_3)_3$$

A ultimate purification of the polymer is obtained by a standard reprecipitation in a solvent/non-solvent mixture.

This process may be applied to the synthesis of other polysilsesquioxanes, i.e. polymers with a formula $(RSiO_{3/2})_n$ where R is a radical of any nature (for example, an alkyl such as methyl or aryl, especially phenyl).

As a chain-terminating agent, it is also possible to use a $Z_3SiCl$ type compound, Z being an alkyl or alkoxy grouping.

EXAMPLE OF SYNTHESIS

A mixture of 60 cm³ of ether and 60 cm³ of vinyltrichlorosilane is poured drop by drop into a mixture of 500 g of crushed ice and 80 cm³ of ethyl ether. After a few minutes, 200 cm³ of ether is added. The etherified product is washed, shaken with 2 cm³ of ammonia and then washed again up to neutrality, evaporated and dried. About 30 g of product is collected. This product is dissolved in 240 cm³ of freshly distilled methylethylketone. 15 cm³ of distilled triethylamine is added and left under reflux for 15 hours. After evaporation and drying under high vacuum, the polymer is redissolved in 240 cm³ of freshly distilled methylethylketone in the presence of 7 cm³ of triethylamine and 6 cm³ of $(CH_3)_3SiCl$ as a terminating agent.

The product is then cooled to promote the filtering of the triethylamine hydrochlorate, evaporated and dried.

The polymer obtained (25 to 28 g) is powdery and white. It is purified by reprecipitation in a methanol/methylethylketone mixture.

With this product, typically a molecular mass equal to 40,000 and a dispersivity of 1.4 are obtained.

FIG. 1 shows a GPC (gel permeation chromatography) recording representing the product obtained.

The conditions corrsponding to the first step are not critical and may therefore be slightly modified as is generally the case in the literature.

For the second step, we could work with a reduced quantity of solvent, of 50 to 250 cm³, and we could use other ketones (methylisobutylketone for example) or even ethyl acetate, toluene, benzene or ethers with sufficiently high boiling temperature. The base used may be another amine (tributylamine for example) or pyridine.

These observations apply also to the third step. Furthermore, the terminating agent could be another compound of the family $Z_3SiCl$.

A repetition of the second step, before proceeding to the third step, is particularly advantageous. Thus, for the above example of synthesis, in carrying out the second step twice, a molecular mass of 50,000 instead of 40,000 is obtained, with no change taking place in the value of the dispersivity. The third step too may be repeated two or more times.

Polysilsesquioxane is a material sensitive to electrons, X-rays and also to rays in the extreme UV range, owing to the presence of the vinyl groups which get cross-linked as can be seen from the curves of sensitivity of the material as a function of the X-rays (FIG. 2) and as a function of the electrons (FIG. 3). This resin can therefore be used for making images in microlithography according to standard processes and, more particularly, in the two-layer processes.

The table 1, placed at the end of the description, shows the measured values of the sensitivity and contrast parameters for polysilsesquioxane (PVS synthesized according to the process of the invention, and for the commercially available resin of a similar nature: SNR (from the firm Japan Synthetic Rubber) which is a resin containing silicon. The table shows that the compound according to the invention has a substantially increased sensitivity, with a contrast that is slightly reduced but, all the same, sufficient for these resins are designed to be used in two-layer processes, hence in a very thin layer. Furthermore, PVS very quickly gets converted into silica under oxygen plasma and no longer changes thereafter: its speed of erosion under oxygen plasma is estimated at 50 angstroms/minute, i.e. appreciably lower than that of SNR.

The table 2, placed at the end of the description, presents the characteristics of some non-siliceous commercially available resins as compared with PVS synthesized by the process according to the invention. These non-siliceous resins can be used solely in a three-layer process. Table 2 groups the resins KPR and KTFR marketed by the firm KODAK and the resins CBR M901, CIR 701 and CIR 70E marketed by the firm Japan Synthetic Rubber.

It is seen that the performance characteristics of PVS are very satisfactory, even without taking account of the simplification that it brings to the lithography process. Consequently, PVS can be employed as a layer capable of being used to make images by X-ray or electron microlithography for the fabrication of submicronic structures. Furthermore, PVS may be used for the fabrication of silica masks according to the teaching of FR 2 144 024. Owing to its low absorption in the near ultra-violet to near infra-red range, PVS can be used as an anti-reflection layer according to the teaching of K. L. Marshall et al., *Journal of Applied Physics*, Vol. 64(5), Sept. 1988, pp. 2279-2285. Its index of 1.44 enables its use for making light microguides, and more generally in any optical interconnection device. PVS may be made photosensitive by the addition of a photosensitizer, according to the process well known to those skilled in the art. Its high resolution enables it to be used as an optical recording medium and, especially, as a memory for optical recording of the WORM (Write Once Read Many) type. The PVS may also be used to make buffer layers in polymer multiple layer systems.

TABLE 1

| Product | Parameter | X-rays | Electrons |
| --- | --- | --- | --- |
| SNR | Sensitivity | 65 mJ/cm$^2$ | 13 μC/cm$^2$ |
|  | Contrast | 1.6 | 1.7 |
| PVS | Sensitivity | 2.1 mJ/cm$^2$ | 2.9 μC/cm$^2$ |
|  | Contrast | 1.4 | 1.4 |

TABLE 2

| Product | Sensitivity | Contrast |
| --- | --- | --- |
| KPR | 10 mJ/cm$^2$ | 1.5 |
| KTFR | 25 mJ/cm$^2$ | 0.9 |
| CBR M901 | 0.8 mJ/cm$^2$ | 0.9 |
| CIR 701 | 6 mJ/cm$^2$ | 1.1 |
| CIR 70E | 3.4 mJ/cm$^2$ | 0.9 |

TABLE 2-continued

| Product | Sensitivity | Contrast |
| --- | --- | --- |
| PVS | 2.1 mJ/cm$^2$ | 0.4 |

What is claimed is:
1. A process for synthesizing polysilsesquioxane comprising the steps of:
   (i) hydrolyzing a mixture of ether and a trichlorosilane wherein said trichlorosilane has the general formula RSiCl$_3$ where R represents an organic radical consisting of an alkyl, aryl, vinyl or allyl, thereby obtaining first solid products;
   (ii) collecting first solid products resulting from step (i),
   (iii) dissolving said solid product in an anhydrous ketonic solvent in the presence of an amine base while heating
   (iv) evaporating and drying the solution of step (ici) until a second solid product is obtained,
   (v) dissolving said second solid products in an anhydrous ketonic solvent with a chain terminating agent while heating until a second solution is obtained, and
   (vi) filtering, evaporating and drying said second solution to obtain said polysilsesquioxane.
2. The process of claim 1 wherein said amine base is selected from the group consisting of triethylamine, tributylamine and pyridine.
3. A synthesizing process according to claim 1, wherein the radical R represents a vinyl grouping.
4. A synthesizing process according to either of the claims 1 or 3, wherein the chain-terminating agent is a compound of the family Z$_3$SiCl where Z Is an alkyl or alkoxy grouping.

* * * * *